(12) United States Patent
Fuku et al.

(10) Patent No.: US 10,403,559 B2
(45) Date of Patent: Sep. 3, 2019

(54) POWER SEMICONDUCTOR DEVICE

(71) Applicant: Mitsubishi Electric Corporation, Tokyo (JP)

(72) Inventors: Masaru Fuku, Tokyo (JP); Noriyuki Besshi, Tokyo (JP); Ryuichi Ishii, Tokyo (JP); Takayuki Yamada, Tokyo (JP); Takao Mitsui, Tokyo (JP); Komei Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/078,349

(22) PCT Filed: May 26, 2016

(86) PCT No.: PCT/JP2016/065550
§ 371 (c)(1),
(2) Date: Aug. 21, 2018

(87) PCT Pub. No.: WO2017/203650
PCT Pub. Date: Nov. 30, 2017

(65) Prior Publication Data
US 2019/0074236 A1  Mar. 7, 2019

(51) Int. Cl.
*H01L 23/52* (2006.01)
*H01L 23/373* (2006.01)
(Continued)

(52) U.S. Cl.
CPC ...... *H01L 23/3735* (2013.01); *H01L 21/3205* (2013.01); *H01L 21/52* (2013.01);
(Continued)

(58) Field of Classification Search
CPC .......... H01L 2224/27505; H01L 24/32; H01L 24/29; H01L 28/60; H01L 2224/73265; H01L 2224/8384; H01L 2924/48227
(Continued)

(56) References Cited

U.S. PATENT DOCUMENTS 6,818,539 B1   11/2004 Kanda
10,083,948 B2 *  9/2018 Yasui ................... H01L 23/28
(Continued)

FOREIGN PATENT DOCUMENTS

JP  02-281737 A  11/1990
JP  2001-077150 A  3/2001
(Continued)

OTHER PUBLICATIONS

International Search Report for PCT/JP2016/065550 dated Aug. 16, 2016 [PCT/ISA/210].
(Continued)

*Primary Examiner* — S. V. Clark
(74) *Attorney, Agent, or Firm* — Sughrue Mion, PLLC; Richard C. Turner

(57) ABSTRACT

In a power semiconductor device, the thickness dimension of a protective film of a semiconductor element is made smaller than that of an upper electrode, so a protective film is not pressed by being pressurized from upward when bonded by a metal sintered body, and the force of tearing off the upper electrode riding on an inclined surface of the protective film does not act, so that no crack of the upper electrode occurs, thus maintaining the soundness of the semiconductor element. Also, a lead bonded by a solder to the upper electrode of the semiconductor element is made of a copper-Invar clad material, the linear expansion coefficient
(Continued)

of which is optimized, and thereby it is possible to realize a durability superior to that of a heretofore known wire-bonded aluminum wiring.

15 Claims, 4 Drawing Sheets

(51) Int. Cl.
| | |
|---|---|
| *H01L 23/48* | (2006.01) |
| *H01L 21/3205* | (2006.01) |
| *H01L 23/522* | (2006.01) |
| *H01L 21/52* | (2006.01) |
| *H01L 25/07* | (2006.01) |
| *H01L 21/768* | (2006.01) |
| *H01L 25/18* | (2006.01) |
| *H01L 23/043* | (2006.01) |
| *H01L 23/367* | (2006.01) |
| *H01L 23/00* | (2006.01) |

(52) U.S. Cl.
CPC .......... *H01L 21/768* (2013.01); *H01L 23/043* (2013.01); *H01L 23/3672* (2013.01); *H01L 23/48* (2013.01); *H01L 23/522* (2013.01); *H01L 23/562* (2013.01); *H01L 24/73* (2013.01); *H01L 25/07* (2013.01); *H01L 25/18* (2013.01); *H01L 2224/40137* (2013.01); *H01L 2224/48091* (2013.01); *H01L 2224/73221* (2013.01); *H01L 2224/73265* (2013.01); *H01L 2924/1033* (2013.01); *H01L 2924/10253* (2013.01); *H01L 2924/10272* (2013.01); *H01L 2924/13055* (2013.01); *H01L 2924/181* (2013.01); *H01L 2924/3512* (2013.01)

(58) Field of Classification Search
USPC ........................................ 257/691, 706, 707
See application file for complete search history.

(56) References Cited

U.S. PATENT DOCUMENTS

| | | | |
|---|---|---|---|
| 2003/0102553 A1* | 6/2003 | Ishikawa ............. | H01L 23/3735 |
| | | | 257/707 |
| 2005/0046025 A1 | 3/2005 | Kanda | |
| 2008/0042298 A1 | 2/2008 | Kanda | |
| 2008/0048334 A1 | 2/2008 | Kanda | |
| 2008/0258298 A1 | 10/2008 | Kanda | |
| 2009/0243089 A1 | 10/2009 | Hohlfeld et al. | |
| 2019/0035703 A1* | 1/2019 | Nishimoto .............. | H01L 23/36 |
| 2019/0122998 A1* | 4/2019 | Hino ................... | H01L 21/4875 |
| 2019/0132956 A1* | 5/2019 | Terasaki ............... | H05K 1/0306 |

FOREIGN PATENT DOCUMENTS

| | | |
|---|---|---|
| JP | 2014-239170 A | 12/2014 |
| JP | 2015-220382 A | 12/2015 |
| JP | 2015-222759 A | 12/2015 |
| JP | 2016-051878 A | 4/2016 |

OTHER PUBLICATIONS

Communication dated Apr. 16, 2019, from the Japanese Patent Office in counterpart application No. 2018-518881.

* cited by examiner

FIG. 9
| Sample No. | Thickness of silicon nitride (mm) | Thickness of copper (mm) | Stress on semiconductor element (Mpa) |
|---|---|---|---|
| 1 | 0.32 | 0.8 | 90 |
| 2 | 0.32 | 1.0 | 115 |
| 3 | 0.25 | 0.8 | 110 |
| 4 | 0.3 | 0.85 | 102 |
FIG. 10
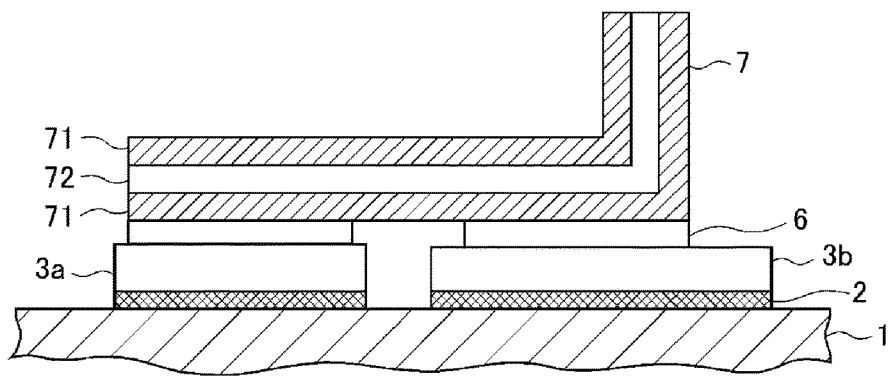
FIG. 11
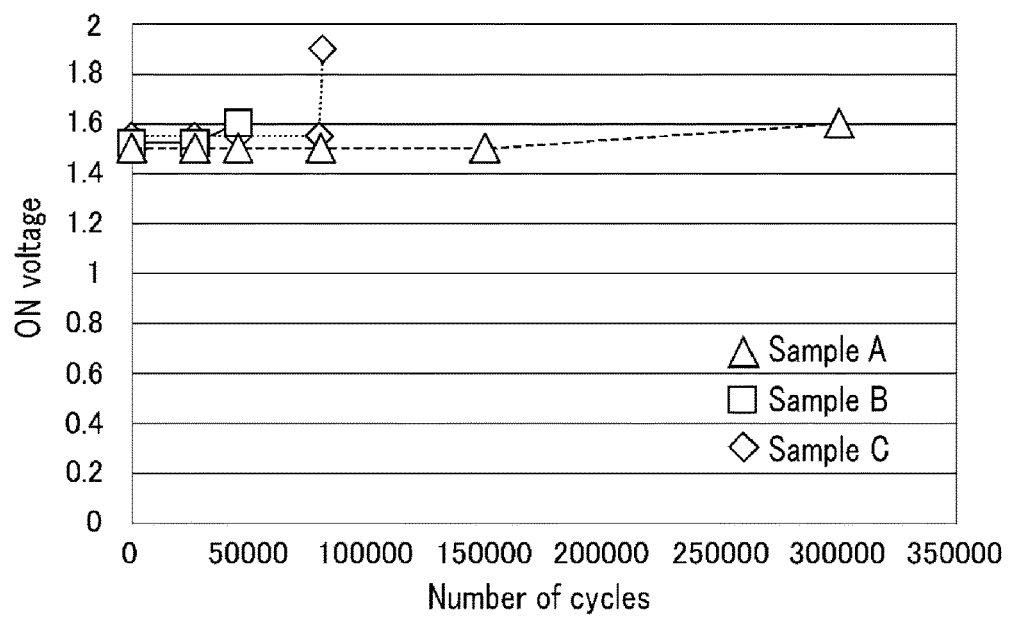

POWER SEMICONDUCTOR DEVICE

CROSS REFERENCE TO RELATED APPLICATIONS

This application is a National Stage of International Application No. PCT/JP2016/065550 filed May 26, 2016.

TECHNICAL FIELD

The present invention relates to a power semiconductor device and particularly to a structure for achieving an improvement in durability and a reduction in cost.

BACKGROUND ART

A power semiconductor device is used to control the main power of a wide range of apparatuses and devices, from industrial equipment to home electrical appliances and information terminals, and particularly, a high reliability is required for a transportation unit for in-car use or the like. As a heretofore known power semiconductor device, PTL 1 proposes a power semiconductor device wherein a power semiconductor element is bonded via a solder to the upper surface of an insulating substrate, an aluminum heat dissipation member is bonded via a solder to the rear surface of the insulating substrate, and furthermore, an upper electrode of the power semiconductor element is connected to an external terminal via a bonding wire.

As in PTL 1, a reduction in thermal resistance in a bounding portion is achieved by using a solder to bond the heat dissipation member and the insulating substrate, and a lightweight power semiconductor device is obtained by using the aluminum heat dissipation member. In PTL 1, the portion of the heat dissipation member bonded to the insulating substrate is fitted in an iron frame material, thereby restraining the aluminum heat dissipation member from expanding due to heat.

Also, PTL 2 discloses a power semiconductor device using a metal sintered body to bond a rear surface electrode of a semiconductor element and a wiring member. In this heretofore known example, a paste-like bonding material is applied to the circuit surface side of the wiring member, and is pressurized and heated from upward and downward with the rear surface of the power semiconductor device disposed on and opposite the bonding material, thereby forming a bonding layer of the metal sintered body. As in PTL 2, the metal sintered body is used to bond the semiconductor element and the wiring member, and thereby no crack occurs in the bonding portion, improving a bonding reliability in high temperature operation.

CITATION LIST

Patent Literature

PTL 1: JP-A-2015-220382
PTL 2: JP-A-2014-239170

SUMMARY OF INVENTION

Technical Problem

However, when a solder is used to bond an aluminum heat dissipation member, comparatively high in linear expansion coefficient, and an insulating substrate, the difference in linear expansion coefficient between the aluminum and the insulating substrate is large, and a solder crack occurs early, thus inhibiting heat conduction, resulting in insufficient cooling. In order to prevent the solder crack, it is conceivable to increase the thickness dimension of a copper (Cu) pattern layer of the bonded surface of the insulating substrate and thus bring the linear expansion coefficient of the insulating substrate close to that of the aluminum.

On the other hand, when the thickness dimension of the copper pattern layer of the insulating substrate is increased, there arises a problem in that the difference in linear expansion coefficient between the semiconductor element and the insulating substrate increases and a crack occurs early in the solder which bonds the semiconductor element and the insulating substrate. In recent years, in the case of a semiconductor element using silicon carbide (SiC) which is being developed as a semiconductor material to replace silicon (Si), a high temperature operation at 150° C. or more is possible, but there is a problem in that the high temperature operation is limited in order to prevent a solder crack from occurring, thus not fully taking advantage of silicon carbide.

Also, in PTL 1, the portion of the heat dissipation member bonded to the insulating substrate is fitted in the iron frame material in order to restrain the aluminum heat dissipation member from expanding due to heat, but the bonded portion of the heat dissipation member is divided into a plurality of blocks, and there is a problem in that it is necessary to fix the frame member to the outer periphery of each block, leading to an increase in material cost and a complexity of a manufacturing process which are caused by an increase in the number of parts.

Meanwhile, when the semiconductor element and the insulating substrate are bonded by the metal sintered body, as in PTL 2, a solder crack of the bonding portion can be avoided, but in some cases, the upper electrode of the semiconductor element is cracked by being pressurized when bonded by the metal sintered body. The upper electrode in which the crack occurs becomes nonuniform in in-plane current distribution, and there is a possibility that current concentrates in a specific portion, breaking the semiconductor element.

Also, in PTL 1, the upper electrode of the semiconductor element and the external terminal are connected by wire bonding, but in the case of a semiconductor element through which to cause a large current to flow, it is necessary to connect a considerable number of bonding wires. Because of this, in a large sized power semiconductor device on which a plurality of insulating substrates are mounted, there is a problem in that a processing cost increases with an increase in man-hours for wire bonding. Also, there is a problem in that when even one bonding wire fails to be wire bonded, a cooler which is the heat dissipation member and the plurality of insulating substrates are discarded, thus resulting in an increase in spoilage cost.

The invention, taking into consideration the above-mentioned problems, has for its object to provide an inexpensive power semiconductor device which enables a realization of a high reliability of being durable enough even for use in a harsh environment such as in-car use.

Solution to Problem

The power semiconductor device according to the invention includes a semiconductor element bonded via a metal sintered body to one principal surface of an insulating substrate; an aluminum cooler bonded via a solder to the other principal surface of the insulating substrate; an upper electrode and a protective film which are provided on the surface of the semiconductor element opposite to the surface thereof bonded to the insulating substrate; and a lead bonded via a solder to the upper electrode, wherein the protective film, being disposed so as to be in contact with a peripheral end portion of the upper electrode, is smaller in thickness dimension than the upper electrode, and an end portion of the protective film in contact with the upper electrode has an inclined surface having an inclination of less than 90 degrees with respect to the plane of the semiconductor element, wherein the peripheral end portion of the upper electrode rides on the end portion of the protective film including the inclined surface.

Advantageous Effects of Invention

According to the power semiconductor device of the invention, as the thickness dimension of the protective film of the semiconductor element is made smaller than that of the upper electrode, so the protective film is not pressed by being pressurized from upward when bonded by the metal sintered body, and the force of tearing off the upper electrode riding on the inclined surface of the protective film does not act, so that no crack of the upper electrode occurs, thus maintaining the soundness of the semiconductor element. Also, the insulating substrate is bonded to the aluminum cooler via the solder, thus optimizing the linear expansion coefficient of the insulating substrate so as to reduce the difference in linear expansion coefficient from the aluminum, and thereby it is possible to suppress an occurrence of an early crack of the solder. Furthermore, the insulating substrate and the semiconductor element are bonded by the metal sintered body, and so no crack occurs in the bonding portion of the insulating substrate and the semiconductor element. For these reasons, according to the invention, it is possible to obtain an inexpensive power semiconductor device which enables a realization of a high reliability of being durable enough even for use in a harsh environment such as in-car use, and which does not involve an increase in the number of parts and in material cost or a complexity of a manufacturing process.

The foregoing and other objects, features, aspects, and advantages of the present invention will become more apparent from the following detailed description of the present invention when taken in conjunction with the accompanying drawings.

BRIEF DESCRIPTION OF DRAWINGS

FIG. 9 is a diagram showing results of calculations by simulating the layer configurations of the insulating substrate and the stresses on the semiconductor element, in the power semiconductor device according to Embodiment 1 of the invention.

FIG. 10 is a sectional view showing a configuration of a lead of the power semiconductor device according to Embodiment 1 of the invention.

FIG. 11 is a diagram showing results of a power cycle evaluation in the semiconductor element according to Embodiment 1 of the invention.

DESCRIPTION OF EMBODIMENTS

Embodiment 1

Figure 1:
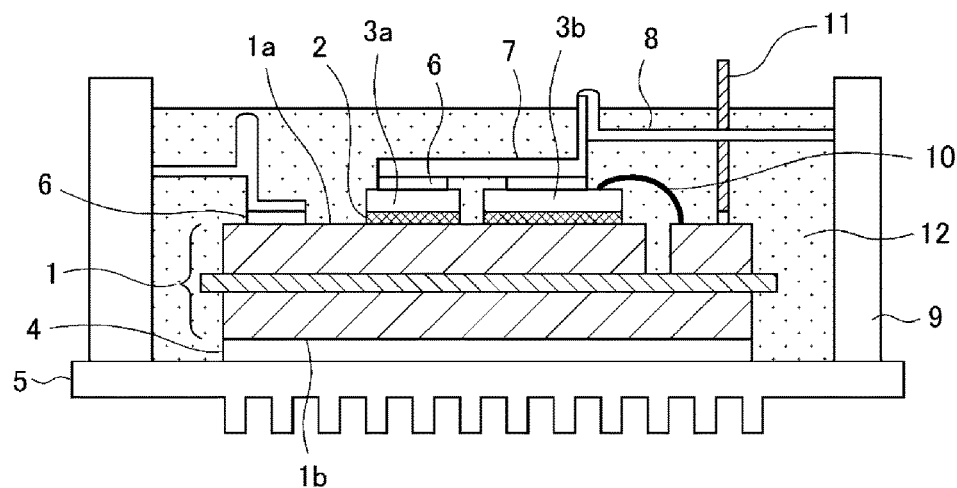
FIG. 1 is a sectional view showing a configuration of a power semiconductor device according to Embodiment 1 of the invention.
Figure 2:
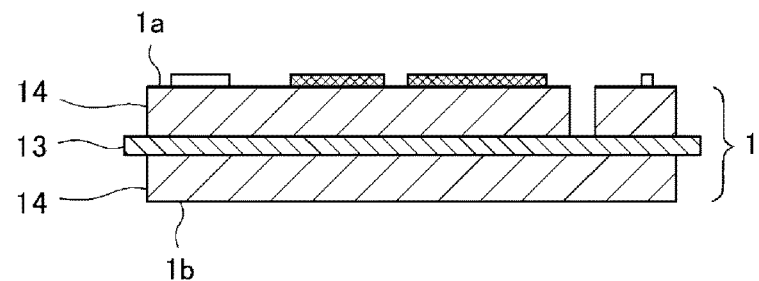
FIG. 2 is a sectional view showing an insulating substrate of the power semiconductor device according to Embodiment 1 of the invention.
Figure 3:
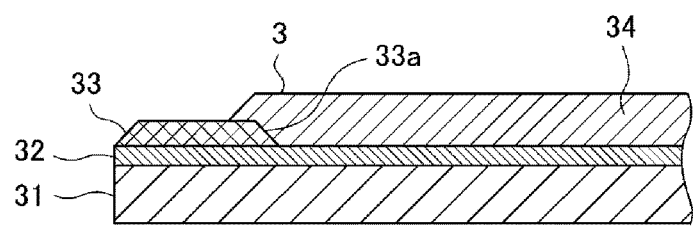
FIG. 3 is a fragmentary sectional view showing a configuration of an upper electrode of the semiconductor element according to Embodiment 1 of the invention.

Hereafter, a description will be given, based on the drawings, of a power semiconductor device according to Embodiment 1 of the invention. FIG. 1 is a sectional view showing a configuration of a power conversion device which is the power semiconductor device according to Embodiment 1, FIG. 2 is a sectional view showing a configuration of an insulating substrate of the power semiconductor device according to Embodiment 1, and FIG. 3 is a fragmentary sectional view showing a configuration of an upper electrode of a semiconductor element according to Embodiment 1. In the individual drawings, identical signs are given to identical and equivalent portions in the drawings.

The power semiconductor device according to Embodiment 1 is configured of an insulating substrate 1, semiconductor elements 3a and 3b (collectively referred to as a semiconductor element 3), an aluminum cooler 5, a lead 7, a casing 9, silicon gel 12, and the like, as shown in FIG. 1. The semiconductor element 3 is bonded to one principal surface 1a of the insulating substrate 1 via a metal sintered body 2, and the cooler 5 is bonded to the other principal surface 1b via a solder 4. The insulating substrate 1 has copper plates 14 bonded one to each surface of an insulating layer 13, as shown in FIG. 2, and a copper (Cu) pattern layer is formed on the front surface of the copper plate 14.

A rear surface electrode (not shown) of the semiconductor element 3 is bonded via the metal sintered body 2 to a predetermined portion on the principal surface 1a of the insulating substrate 1. For example, a silver (Ag) sintered body is used as the metal sintered body 2. As shown in FIG. 3, a protective film 33 and an upper electrode 34 are provided on the surface of the semiconductor element 3 opposite to the surface thereof bonded to the insulating substrate 1. The lead 7 made of a copper-Invar clad material is bonded to the upper electrode 34 via a solder 6. The lead 7 is bonded by welding to a bus bar 8 fixed to the casing 9.

The semiconductor element 3 is, for example, an IGBT, and is connected to a signal pin 11, which is connected to a drive substrate (not shown), by a wire 10 which is an aluminum wiring, and thus a signal is inputted into the semiconductor element 3. The inside of the casing 9 is sealed with the silicon gel 12 up to above the lead 7.

A description will be given, using FIG. 3, of a structure of the upper electrode 34 of the semiconductor element 3 according to Embodiment 1. The semiconductor element 3 is such that an aluminum-silicon alloy layer 32 (hereafter the AlSi layer 32) is formed on a silicon substrate 31 and that the protective film 33 and the upper electrode 34 are provided on the AlSi layer 32. A method of manufacturing thereof is such that, first, the protective film 33 is formed on top of the silicon substrate 31 on which the AlSi layer 32 is formed, and nickel (Ni) plating is applied with the protective film 33 as a mask, thus forming the upper electrode 34.

The protective film 33 is disposed so as to be in contact with a peripheral end portion of the upper electrode 34, and is smaller in thickness dimension than the upper electrode 34. An end portion of the protective film 33 in contact with the upper electrode 34 has an inclined surface 33a having an inclination of less than 90 degrees with respect to the plane of the semiconductor element 3, and the peripheral end portion of the upper electrode 34 rides on the end portion of the protective film 33 including the inclined surface 33a.

Figure 5:
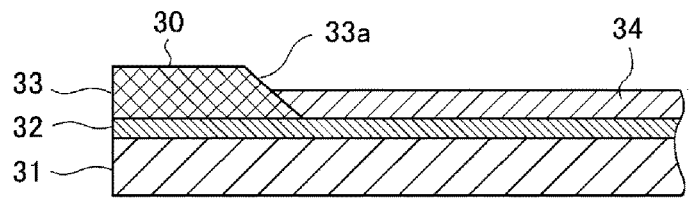
FIG. 5 is a fragmentary sectional view showing a configuration of an upper electrode of a semiconductor element in a heretofore known power semiconductor device.
Figure 6:
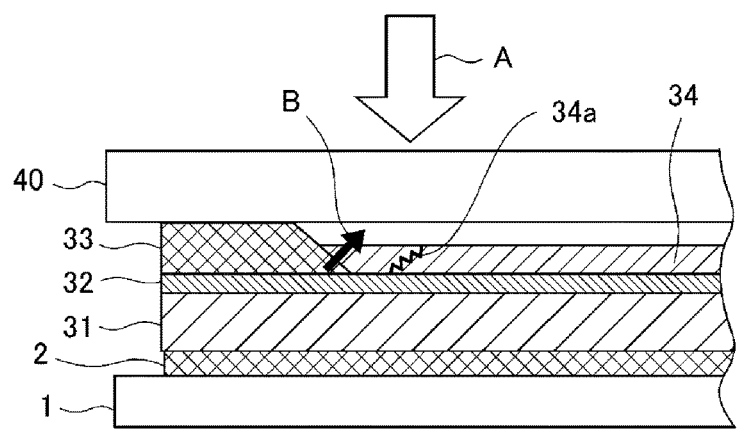
FIG. 6 is a diagram showing a mounting process of the heretofore known power semiconductor device.

A description will be given, using FIG. 4, of amounting process wherein the semiconductor element 3 having the thus configured upper electrode 34 is bonded to the insulating substrate 1 by the metal sintered body 2. Also, as a comparison example, FIG. 5 shows a structure of an upper electrode of a semiconductor element in a heretofore known power semiconductor device, and FIG. 6 shows a mounting process wherein the semiconductor element and an insulating substrate, in the heretofore known power semiconductor device, are bonded by a metal sintered body. In the mounting process of the power semiconductor device, a paste-like bonding material is applied to a predetermined portion on the insulating substrate 1, and is pressurized and heated with the rear surface of the semiconductor element 3 disposed on and opposite the bonding material, thereby forming the metal sintered body 2.

In a heretofore known semiconductor element 30 too, the upper electrode 34 is formed by nickel plating with the previously formed protective film 33 as a mask, as shown in FIG. 5, but the protective film 33 is formed to be larger in thickness dimension than the upper electrode 34. Also, the end portion of the protective film 33 in contact with the upper electrode 34 forms the inclined surface 33a, and the peripheral end portion of the upper electrode 34 rides on the inclined surface 33a of the protective film 33.

In the mounting process wherein the heretofore known semiconductor element 30 configured in this way is bonded to the insulating substrate 1 by the metal sintered body 2, pressure is applied from the upper electrode 34 side of the semiconductor element 30, as shown by the arrow A in FIG. 6, so the protective film 33 larger in thickness dimension is pressed by a pressure jig 40, and a force acts in the direction (the arrow B in FIG. 6) in which the upper electrode 34 riding on the inclined surface 33a of the protective film 33 is torn off the AlSi layer 32 of the semiconductor element 30. Because of this, it may happen that a crack 34a occurs in the upper electrode 34 of the semiconductor element 30.

Figure 4:
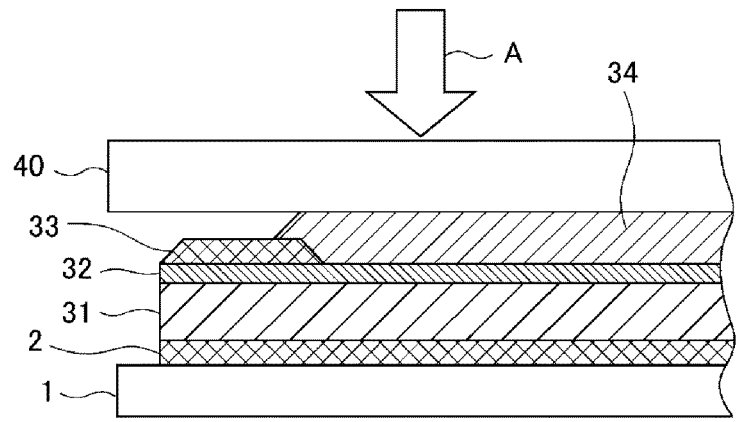
FIG. 4 is a diagram showing a mounting process of the power semiconductor device according to Embodiment 1 of the invention.

In contrast, in the case of the semiconductor element 3 according to Embodiment 1, when pressure is applied from the upper electrode 34 side of the semiconductor element 3, as shown by the arrow A in FIG. 4, the upper electrode 34 larger in thickness dimension than the protective film 33 is pressed by the pressure jig 40, and the force of tearing off the upper electrode 34 does not occur. Because of this, it does not happen that the upper electrode 34 cracks, and the soundness of the semiconductor element 3 is maintained. That is, the upper electrode structure of the semiconductor element 3 according to Embodiment 1 is of a configuration suitable to the bonding by the metal sintered body 2 for avoiding a solder crack in the portion bonded to the insulating substrate 1.

Also, the power semiconductor device according to Embodiment 1 includes the aluminum cooler 5 which is light in weight and comparatively large in linear expansion coefficient, wherein the solder 4 is used to bond the insulating substrate 1 and the cooler 5. In such a case, when the difference in linear expansion coefficient between the aluminum and the insulating substrate 1 is large, it may happen that a crack occurs early in the solder 4, so it is necessary to bring the linear expansion coefficient of the insulating substrate 1 close to that of the aluminum.

When a solder is used to bond the insulating substrate 1 and the semiconductor element 3, it is necessary to prevent a solder crack by reducing the difference in linear expansion coefficient between the insulating substrate 1 and the semiconductor element 3, but there occurs a discrepancy in that when the linear expansion coefficient of the insulating substrate 1 is brought close to that of the semiconductor element 3, the difference in linear expansion coefficient from the aluminum increases. In Embodiment 1, the metal sintered body 2 is used to bond the insulating substrate 1 and the semiconductor element 3, and so no crack occurs. Consequently, it is only necessary to optimize the linear expansion coefficient of the insulating substrate 1 in order that the difference in linear expansion coefficient from the aluminum decreases.

The insulating substrate 1 of the power semiconductor device according to Embodiment 1 has the copper plates 4 bonded one to each surface of silicon nitride (SiN) which is the insulating layer 13, as shown in FIG. 2, wherein the thickness dimension of the insulating layer 13 is 0.3 mm to 0.34 mm, and the thickness dimension of the copper plates 14 is 0.75 mm to 0.85 mm.

Figure 7:
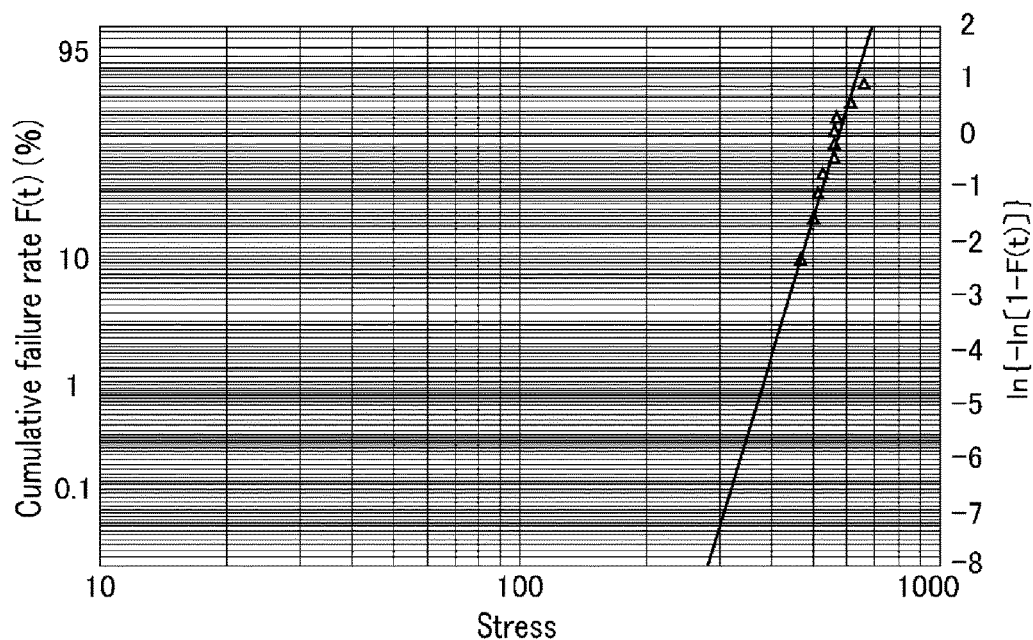
FIG. 7 is a diagram which Weibull plots failure rates when stresses are applied to the semiconductor element according to Embodiment 1 of the invention.

FIG. 7 is a diagram which Weibull plots failure rates when stresses are applied to the semiconductor element of the power semiconductor device according to Embodiment 1. Ten samples of a 120-μm thick silicon substrate as the semiconductor element 3 are measured for their deflective strengths, and the values of stresses occurring when the individual samples break are plotted. For example, when the target failure rate of a power semiconductor device on which 20 semiconductor elements 3 are mounted is set to 1 ppm, a breaking stress of 1 ppm/20 can be estimated to be 117 Mpa.

In the layer configuration of the previously described insulating substrate 1, that is, a thickness dimension of 0.3 mm to 0.34 mm of the insulating layer 13 and a thickness dimension of 0.75 mm to 0.85 mm of the copper plates 14, a configuration closest in linear expansion coefficient to aluminum is a combination of a minimum thickness dimension of 0.3 mm of the insulating layer 13 and a maximum thickness dimension of 0.85 mm of the copper plates 14 (Sample 4 shown in FIG. 9). When in the combination, the linear expansion coefficient of the insulating substrate 1 is largest, and so a stress applied to the semiconductor element 3 is largest. That is, when Sample 4 satisfies a target stress, it means that the above-mentioned layer configuration of the insulating substrate 1 satisfies the target stress.

Figure 8:
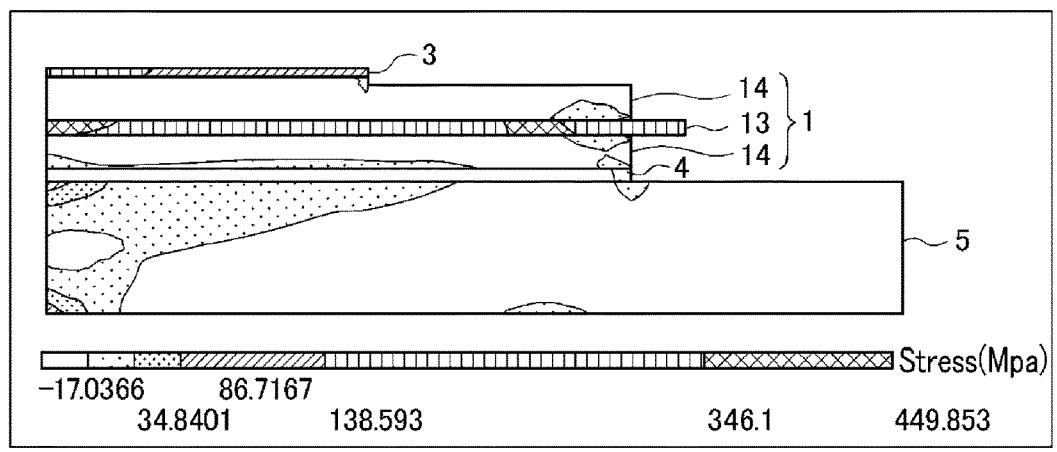
FIG. 8 is a diagram showing an example of simulating layer configurations of the insulating substrate and stresses on the semiconductor element, in the power semiconductor device according to Embodiment 1 of the invention.

In Embodiment 1, calculations are made by simulating layer configurations of the insulating substrate 1 such that stresses applied to the semiconductor element 3 are 117 Mpa or less. FIG. 8 shows an example wherein layer configurations of the insulating substrate and stresses applied to the semiconductor element, in the power semiconductor device, are simulated, and FIG. 9 shows results of the calculations from the simulations. In the simulations, stresses applied to the cooler 5, the insulating substrate 1, and the semiconductor element 3 are calculated in a heat shock test which repeats a temperature change of −40° C. to 150° C., and the stresses applied to the semiconductor element 3 are taken by reference to values thereof obtained from slightly inside the end portion of the semiconductor element 3. FIG. 8 shows a rough distribution of stresses for convenience, but in fact, a more detailed stress distribution is obtained.

Sample 1 shown in FIG. 9, that is, the combination of a thickness dimension of 0.32 mm of silicon nitride which is the insulating layer 13 and a thickness dimension of 0.8 mm of the copper plates 14, is used as a reference layer configuration of the insulating substrate 1. With the reference layer configuration, a stress applied to the semiconductor element 3 is 90 Mpa, fully satisfying the target stress of 117 Mpa. When the thickness dimension of silicon nitride is 0.34 mm which is larger than in Sample 1, and the thickness dimension of the copper plates 14 is 0.75 mm which is smaller than in Sample 1, the linear expansion coefficient of the insulating substrate is smaller than in Sample 1, and the stress on the semiconductor element 3 decreases, thus obviously satisfying a target breaking stress.

In Sample 2 wherein the thickness dimension of the copper plate 14 is increased from 0.8 mm in Sample 1 to 1.0 mm, the linear expansion coefficient of the insulating substrate 1 is larger than in Sample 1, and so the stress on the semiconductor element 3 increases to 115 Mpa. In Sample 2 too, the target stress of 117 Mpa is barely satisfied, but it is determined that it is not desirable in terms of reliability to set the thickness of the copper plates at 1.0 mm.

Also, in Sample 3, too, wherein the thickness dimension of the insulating layer 13 is reduced from 0.32 mm in Sample 1 to 0.25 mm, the linear expansion coefficient of the insulating substrate 1 is larger than in Sample 1, and so the stress on the semiconductor element 3 increases to 110 Mpa. In Sample 3 too, the target stress of 117 Mpa is satisfied, but it is determined that it is not desirable in terms of reliability to set the thickness of the insulating layer 13 at 0.25 mm.

In this way, in Samples 2 and 3, by increasing the thickness dimension of the copper plates 14, or reducing the thickness dimension of the insulating layer 13, relative to the reference layer configuration, the linear expansion coefficient of the insulating substrate 1 increases and comes close to that of the aluminum, but the stress on the semiconductor element 3 increases, and the probability of cracking of the semiconductor element 3 increases.

Meanwhile, in Sample 4 wherein the thickness dimension of the insulating layer 13 is reduced from 0.32 mm in Sample 1 to 0.3 mm, and the thickness dimension of the copper plates 14 is increased from 0.8 mm in Sample 1 to 0.85 mm, the stress on the semiconductor element 3 is 102 Mpa, satisfying the target stress of 117 Mpa.

FIG. 9 shows the results of calculations of four samples, but as a result of carrying out detailed simulations on still more samples, it is revealed that it is possible, by using silicon nitride of a thickness dimension of 0.3 mm to 0.34 mm as the insulting layer 13 of the insulating substrate 1 and a copper plate of a thickness dimension of 0.75 mm to 0.85 mm as the copper plate 14 on each side, to obtain the insulating substrate 1 which satisfies the target stress of 117 Mpa on the semiconductor element 3 and has a small difference in linear expansion coefficient from the aluminum.

Next, a description will be given, using FIG. 10, of a configuration of the lead 7 bonded via the solder 6 to the upper electrode 34 of the semiconductor element 3. In the power semiconductor device according to Embodiment 1, the lead 7 bonded to the upper electrode 34 of the semiconductor element 3 is made of a clad material of a three-layer structure wherein coppers 71 are stacked one on each side of Invar 72, and the coppers 71 and the Invar 72 are pressurized and bonded together, and the ratio in thickness dimension between copper, Invar, and copper is 1:1:1. Also, the linear expansion coefficient of the lead 7 is 8 ppm/° C. to 12 ppm/° C., more desirably, 9 ppm/° C. to 11 ppm/° C.

A description will be given of a reason that, in Embodiment 1, the lead 7 bonded to the upper electrode 34 by the solder 6 is made of the clad material of the coppers 71 and the Invar 72. The power semiconductor device according to Embodiment 1 is assumed to use the silicon gel 12 as a seal material. When using an epoxy resin as the seal material, it is possible to suppress a crack of the solder 6 which bonds the upper electrode 34 and a lead made only of copper.

However, in the power semiconductor device using the aluminum cooler, there is a difference in linear expansion coefficient between the aluminum and the insulating substrate 1, and so when at low temperature in a heat shock test or the like, a convex-upward warpage occurs, and a force acts in a direction in which the epoxy resin is torn off the insulating substrate 1. The warpage causes the epoxy resin to peel off the semiconductor element 3, breaking the semiconductor element 3 in some cases.

For this reason, in the power semiconductor device according to Embodiment 1, the silicon gel 12 which is difficult to peel off the semiconductor element 3 even at low temperature is used, thus preventing the semiconductor element 3 from breaking. However, when using the silicon gel 12 as the seal material, a crack of the solder 6 which bonds the upper electrode 34 of the semiconductor element 3 and the lead 7 is likely to occur, and so it is required to suppress the crack.

In the power semiconductor device according to Embodiment 1, the lead 7 is made of the clad material of the coppers 71 and the Invar 72, and the linear expansion coefficient is optimized in order to prevent the semiconductor element 3 from breaking. When the linear expansion coefficient of the lead 7 is reduced, the difference in linear expansion coefficient from the semiconductor element 3 decreases, so the stress applied to the semiconductor element decreases, and thus it is possible to prevent the semiconductor element 3 from breaking. On the other hand, when the linear expansion coefficient of the lead 7 is reduced, the difference in linear expansion coefficient from the solder 6 increases, and when the difference is too large, a crack of the solder 6 occurs early.

FIG. 11 shows results of a power cycle evaluation, which is commonly implemented as a solder durability evaluation, in the semiconductor element 3 according to Embodiment 1. In FIG. 11, Sample A (△) is a semiconductor element to which is bonded by a solder the lead 7 adopted in the power semiconductor device according to Embodiment 1, that is, a clad material of which the ratio in thickness dimension between copper, Invar, and copper is 1:1:1 and the linear expansion coefficient is 10 ppm/° C.

Also, Sample B (□) is a semiconductor element which is a comparison example of Embodiment 1 and to which is bonded by a solder a clad material of which the ratio in thickness dimension between copper, Invar, and copper is 1:3:1 and the linear expansion coefficient is 7 ppm/° C. Also, Sample C (◇) is a semiconductor element which has a heretofore known wire-bonded aluminum wiring.

As shown in FIG. 11, in Sample C having the heretofore known aluminum wiring, a disconnection occurs at 80,000 cyc as a result of the power cycle evaluation (a condition of ΔTj=90° C.). Also, in Sample B using the clad material of the comparison example of Embodiment 1, as a result of the power cycle evaluation, the solder 6 cracks at 45,000 cyc, resulting in inferiority to the heretofore known aluminum wiring.

In contrast, Sample A using the clad material adopted in the power semiconductor device according to Embodiment 1 obtains a good evaluation result of life extension to 30,000 cyc. Also, a considerable number of heat shock tests of repeating a temperature change of −40° C. to 150° C. are implemented on Sample A to confirm whether or not there is a breakage of the semiconductor element 3, but no breakage of the semiconductor element 3 is confirmed. Sample A has a linear expansion coefficient of 10 ppm/° C., but it is confirmed that Sample A can obtain a life longer enough than in the heretofore known example even when using a clad material of which the linear expansion coefficient is 10 ppm±2 ppm and the ratio in thickness dimension between copper, Invar, and copper is 1:1:1.

It is clarified, from these evaluation results, that the lead 7 to be soldered to the upper electrode 34 of the semiconductor element 3 is made of the clad material of the coppers 71 and the Invar 72, of which the ratio in thickness dimension between copper, Invar, and copper is set to 1:1:1 and the linear expansion coefficient is set to 8 ppm/° C. to 12 ppm/° C., and thereby no breakage of the semiconductor element 3 occurs, and thus that the durability of the solder 6 improves remarkably as compared with in the heretofore known wire-bonded aluminum wiring.

As above, according to the power semiconductor device of Embodiment 1, the thickness dimension of the protective film 33 disposed so as to be in contact with the peripheral end portion of the upper electrode 34 of the semiconductor element 3 is made smaller than that of the upper electrode 34, and so the protective film 33 is not pressed by being pressurized from upward when bonded by the metal sintered body 2, and the force of tearing off the upper electrode 34 riding on the inclined surface 33a of the protective film 33 does not act, so that no crack of the upper electrode 34 occurs, thus maintaining the soundness of the semiconductor element 3.

Also, the insulating substrate 1 is bonded to the aluminum cooler 5 via the solder 4, thus optimizing the linear expansion coefficient of the insulating substrate 1 so as to reduce the difference in linear expansion coefficient from the aluminum, and so it is possible to suppress an occurrence of an early crack of the solder 4. Also, a reduction in thermal resistance is achieved by using the solder 4 to bond the cooler 5 and the insulating substrate 1, and a lightweight power semiconductor device is obtained by using the aluminum cooler 5. Furthermore, as the insulating substrate 1 and the semiconductor element 3 are bonded by the metal sintered body 2, no crack occurs in the bonding portion even when the difference in linear expansion coefficient between the insulating substrate 1 and the semiconductor element 3 is large.

Also, the lead 7 bonded by the solder 6 to the upper electrode 34 of the semiconductor element 3 is made of the clad material of the coppers 71 and the Invar 72, the linear expansion coefficient of which is optimized, and thereby it is possible to realize a durability superior to that of the heretofore known wire-bonded aluminum wiring, and at the same time, even when a plurality of the insulating substrates 1 are mounted on the cooler 5, it is possible to collectively solder the leads 7 to the respective upper electrodes 34 of the semiconductor elements 3, so that it is possible to achieve a reduction in processing cost, and thus to suppress a spoilage cost, as compared with in a heretofore known wire bonding process.

Consequently, according to Embodiment 1, it is possible to obtain an inexpensive power semiconductor device without involving an increase in material cost, processing cost, and the like, wherein it is possible to obtain a high durability in the bonding portion between the cooler 5 and the insulating substrate 1, in the bonding portion between the semiconductor element 3 and the insulating substrate 1, and in the bonding portion between the semiconductor element 3 and the lead 7, and thus to realize a high reliability of being durable enough even for use in a harsh environment such as in-car use. The invention is such that any of embodiments can be appropriately modified or omitted within the scope of the invention.

The invention claimed is:

1. A power semiconductor device, comprising:
   a semiconductor element bonded via a metal sintered body to one principal surface of an insulating substrate; an aluminum cooler bonded via a solder to another principal surface of the insulating substrate; an upper electrode and a protective film which are provided on a surface of the semiconductor element opposite to a surface thereof bonded to the insulating substrate; and a lead bonded via a solder to the upper electrode, wherein
   the protective film, being disposed so as to be in contact with a peripheral end portion of the upper electrode, is smaller in thickness dimension than the upper electrode, and an end portion of the protective film in contact with the upper electrode has an inclined surface having an inclination of less than 90 degrees with respect to the plane of the semiconductor element, wherein the peripheral end portion of the upper electrode rides on the end portion of the protective film including the inclined surface.

2. The power semiconductor device according to claim 1, wherein
   the lead is made of a clad material of coppers and Invar.

3. The power semiconductor device according to claim 2, wherein
   the lead has a linear expansion coefficient of 8 ppm/° C. to 12 ppm/° C.

4. The power semiconductor device according to claim 2, wherein
   the lead has a three-layer structure of the copper, the Invar, and the copper, and the ratio in thickness dimension therebetween is 1:1:1.

5. The power semiconductor device according to claim 3, wherein
   the lead has a three-layer structure of the copper, the Invar, and the copper, and the ratio in thickness dimension therebetween is 1:1:1.

6. The power semiconductor device according to claim 1, wherein
   the metal sintered body is a silver sintered body.

7. The power semiconductor device according to claim 2, wherein
   the metal sintered body is a silver sintered body.

8. The power semiconductor device according to claim 3, wherein
   the metal sintered body is a silver sintered body.

9. The power semiconductor device according to claim 4, wherein
   the metal sintered body is a silver sintered body.

10. The power semiconductor device according to claim 1, wherein
the insulating substrate has copper plates bonded one to each surface of silicon nitride which is an insulating layer, and the thickness dimension of the insulating layer is 0.3 mm to 0.34 mm, while the thickness dimension of the copper plates is 0.75 mm to 0.85 mm.

11. The power semiconductor device according to claim 2, wherein
the insulating substrate has copper plates bonded one to each surface of silicon nitride which is an insulating layer, and the thickness dimension of the insulating layer is 0.3 mm to 0.34 mm, while the thickness dimension of the copper plates is 0.75 mm to 0.85 mm.

12. The power semiconductor device according to claim 3, wherein
the insulating substrate has copper plates bonded one to each surface of silicon nitride which is an insulating layer, and the thickness dimension of the insulating layer is 0.3 mm to 0.34 mm, while the thickness dimension of the copper plates is 0.75 mm to 0.85 mm.

13. The power semiconductor device according to claim 4, wherein
the insulating substrate has copper plates bonded one to each surface of silicon nitride which is an insulating layer, and the thickness dimension of the insulating layer is 0.3 mm to 0.34 mm, while the thickness dimension of the copper plates is 0.75 mm to 0.85 mm.

14. The power semiconductor device according to claim 6, wherein
the insulating substrate has copper plates bonded one to each surface of silicon nitride which is an insulating layer, and the thickness dimension of the insulating layer is 0.3 mm to 0.34 mm, while the thickness dimension of the copper plates is 0.75 mm to 0.85 mm.

15. The power semiconductor device according to claim 1, wherein
the semiconductor element contains silicon, silicon carbide, or gallium nitride as its semiconductor material.

* * * * *